(12) United States Patent
Schmitz et al.

(10) Patent No.: US 6,476,430 B1
(45) Date of Patent: Nov. 5, 2002

(54) INTEGRATED CIRCUIT

(75) Inventors: Jurriaan Schmitz; Andreas H. Montree, both of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/656,990

(22) Filed: Sep. 7, 2000

(30) Foreign Application Priority Data

Sep. 10, 1999 (EP) .............................................. 99202949

(51) Int. Cl.⁷ ........................ H01L 29/80; H01L 31/112
(52) U.S. Cl. ...................... 257/274; 257/240; 257/272; 257/369; 257/371; 257/392
(58) Field of Search ................................. 257/278, 288, 257/272, 274, 240, 369, 371, 392, 400, 408; 438/224, 231, 232

(56) References Cited

U.S. PATENT DOCUMENTS 5,547,894 A    8/1996  Mandelman et al. ......... 437/56
5,618,740 A    4/1997  Huang ........................ 438/224

FOREIGN PATENT DOCUMENTS

DE    19637105 A    4/1997

*Primary Examiner*—Olik Chaudhuri
*Assistant Examiner*—Theresa T. Doan
(74) *Attorney, Agent, or Firm*—Aaron Waxler

(57) ABSTRACT

In transistors with sub-micron channels, short-channel effects, such as a lowering of the threshold voltage, are usually suppressed by means of a halo (or pocket) implant in the source/drain regions, which operation is performed jointly with the LDD implantation. The halo implant, however, decreases the analog performance of transistors. To combine suppression of short-channel effects with a high analog performance, it is proposed to provide only transistors $T_1$, which are not intended for analog functions with the halo implant (16), and to mask the analog transistors $T_2$ with a mask (15) against the halo implant. To avoid short-channel effects in $T_2$, this transistor is provided with a channel whose length is larger than that of transistor $T_1$.

4 Claims, 2 Drawing Sheets

INTEGRATED CIRCUIT

BACKGROUND OF THE INVENTION

The invention relates to an integrated circuit with at least two field-effect transistors of a certain conductivity type, comprising a semiconductor body having a surface region of a first conductivity type adjoining a surface, which is provided with surface zones of the second, opposite, conductivity type forming source and drain zones of said transistors. Such a device is disclosed, for example, in patent document U.S. Pat. No. 5,547,894.

It is well-known that the trend towards ever smaller dimensions of transistors leads to unfavorable changes in certain properties, often referred to as short-channel effects. For example, in the case of a smaller channel length, i.e. a channel length in the sub-micron range, it is possible that, as a result of punch-through between source and drain, the threshold voltage becomes dependent upon the channel length L and, for example, in the case of n-channel transistors becomes lower as L becomes smaller. To suppress these punch-through effects, a halo implantation (often also referred to as pocket implantation) is customarily carried out, resulting in the formation, around the source and drain zones or at least around the LDD parts of these zones, of higher-doped zones of the first conductivity type having a higher doping concentration than the background concentration of the surface region. Provided the doping concentration of the halo zones is not excessively high, it is achieved by these zones, which extend from the source and the drain into the channel over only a very small distance, that the above-described reduction of the threshold voltage as a function of the channel length is completely, or partly, suppressed.

A drawback of the halo implantation resides in that the properties of the transistors become less favorable for analog applications, particularly as regards the output resistance which is reduced substantially. As a result, circuits for both digital and analog signal processing are difficult to design in deep sub-micron technology. It is an object of the invention to provide, inter alia, an integrated circuit which also comprises transistors with good properties for analog applications, while the advantages of the halo implantation are preserved.

SUMMARY OF THE INVENTION

An integrated circuit of the type mentioned in the opening paragraph is characterized in accordance with the invention in that only one of said transistors, hereinafter referred to as first transistor, is provided with a halo implantation to suppress short-channel effects, and in that the other transistor, hereinafter referred to as second transistor, which fulfills an analog function in the circuit, is free of said halo implantation and has a larger channel length than the first transistor. As a result of the absence of the halo implantation in the second transistor, intended for performing analog functions, the output resistance of the transistor is high, i.e. much higher than in the first transistor with halo implantation. By additionally choosing a larger channel length for the second transistor it is achieved that the above-described reduction of the threshold voltage caused by short-channel effects is smaller than for the first transistor, so that the effect of the absence of the halo implantation in the second transistor on the threshold voltage is entirely or partly compensated for.

The channel length of the second transistor can be advantageously chosen to be such that the threshold voltages of the transistors are unequal. A preferred embodiment of a device in accordance with the invention is characterized in that the channel length of the second transistor is such that the threshold voltage of the second transistor is equal, or at least substantially equal, to the threshold voltage of the first transistor.

The invention can be advantageously employed at channel lengths at which a reduction in threshold voltage occurs as a result of short-channel effects. In an important embodiment, the channel length of the first transistor is at the most approximately 0.25 $\mu$m.

These and other aspects of the invention will be apparent from and elucidated with reference to the embodiments described hereinafter.

DESCRIPTION OF THE PREFERRED EMBODIMENTS

Figure 1:
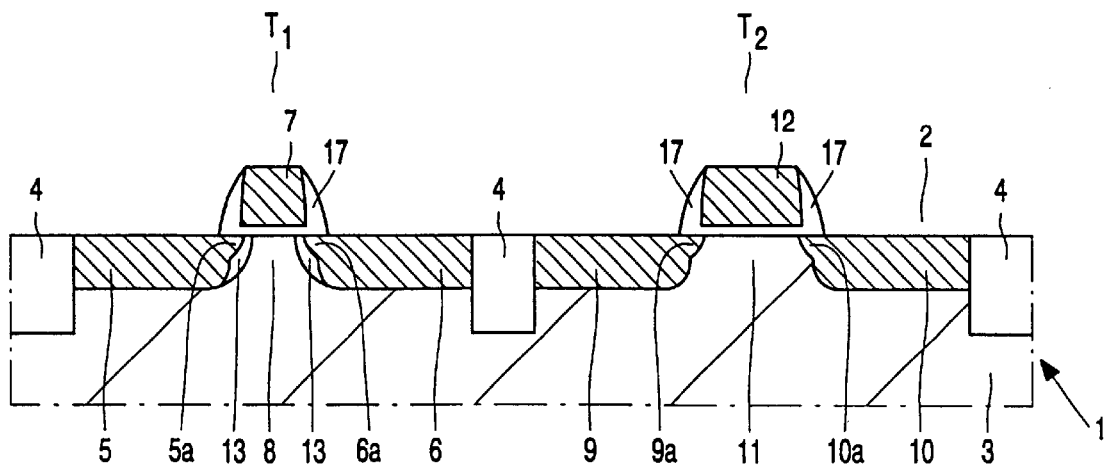
FIG. 1 is a sectional view of a part of an integrated circuit in accordance with the invention.

FIG. 1 shows a part of an integrated circuit in accordance with the invention, comprising two n-channel transistors $T_1$, and $T_2$. In addition to the two transistors shown, the circuit may of course also comprise other transistors, which may be n-channel type as well as p-channel type, and the circuit may also comprise other active and passive circuit elements. In addition, it will be very clear from the description that the invention cannot only be applied in n-channel MOS transistors but also in p-channel MOS transistors.

The device comprises a semiconductor body 1 of silicon with a surface region 3 of the p-type adjoining the surface 2. In the example shown in FIG. 1, the region 3 is represented as a coherent part of the semiconductor body 1. However, this is not necessary. The region 3 may alternatively be composed of two separate sub-regions which may each be formed by a p-well. It is alternatively possible that these sub-regions are not directly adjacent, as shown in FIG. 1, but instead are situated at different locations of the semiconductor body, with the transistors being separated from each other by other circuit elements.

In the surface region 3, two active regions are defined for the transistors $T_1$ and $T_2$ by means of insulation regions 4 which can be formed, for example, by field oxide regions or grooves filled with a material which may or may not be electrically insulating. It is to be noted that the two transistors may of course also be housed in a common active region. Transistor $T_1$ has a source zone and a drain zone 5 and 6, respectively, in the form of highly doped n-type surface zones, and respective low-doped extensions 5a and 6a adjoining the channel 8. Above the channel, and separated therefrom by a customary gate oxide layer, there is provided a gate electrode 7. The source and drain zone of transistor $T_2$ are formed by highly doped n-type surface zones 9 and 10, which are provided with an extension 9a and 10a, respectively, adjoining the channel 11. Above the channel 11, there is provided a gate electrode 12.

Figure 4:
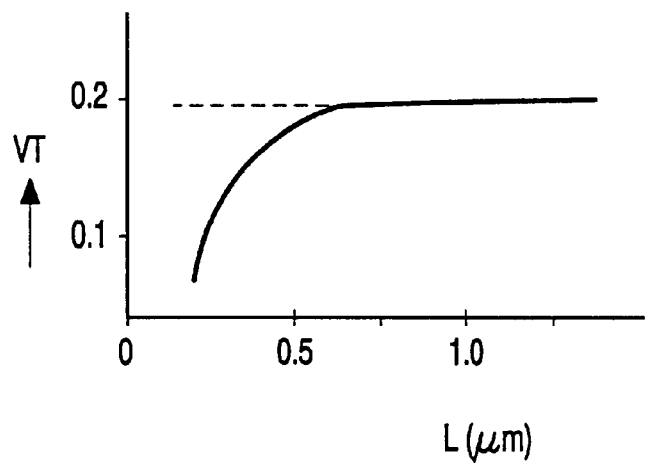
FIG. 4 shows the relationship between the threshold voltage and the channel length.
Figure 5:
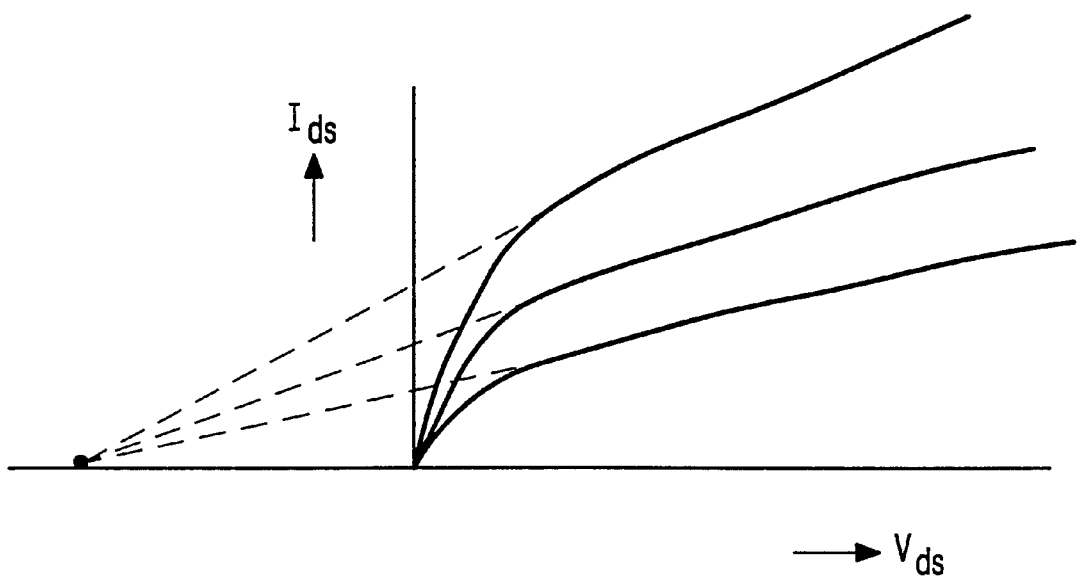
FIG. 5 shows I–V curves for a transistor with halo implantation.

Transistor $T_1$, which may be intended, for example, for digital signal processing, is a short channel transistor with a channel length below 1.0 μm, preferably below 0.5 μm. A specific value for the channel length L in current IC processes is 0.18 μm. At such small values, the properties of the transistor are determined, as is generally known, by short-channel effects. One of these effects is depicted in FIG. 4, i.e. the influence of L on the threshold voltage $V_T$. It has been found that a sufficiently small value of L (dependent upon the process) causes the threshold voltage to deviate substantially from the nominal value as a result of punch-through from drain to source. To suppress these short-channel effects, the transistor $T_1$ is provided with a p-type halo or pocket implantation 13, which causes the p-type background doping to be increased in a part of the surface region 3 near or adjacent to the channel 8. By virtue thereof, the threshold-voltage reduction can be precluded, at least within a certain region of L, as is shown in FIG. 4 by means of the broken line. Apart from this favorable effect, the halo implantation also has an influence on the I–V characteristics of the transistor, as is shown in FIG. 5. In this Figure, the current $I_{ds}$ is plotted on the vertical axis as a function of the voltage $V_{ds}$ on the horizontal axis, for different gate voltages. As a result of the halo implantation, the I–V characteristics are no longer horizontal or substantially horizontal, but exhibit a fairly steep inclination. For analog applications, for example in the case of an analog amplifier, this means that the output resistance, which is preferably high, is reduced substantially. To overcome this drawback, the halo implantation in transistor $T_2$, which is intended for analog applications in the circuit, is omitted, as is shown in FIG. 1. In order to simultaneously preclude the above-described threshold-voltage reduction, the channel length of $T_2$ is chosen to be larger than that of $T_1$, the channel length of $T_2$ preferably being such that short-channel effects have no, or hardly any, influence on the threshold voltage. To achieve this, a value for the channel length L can be chosen of, for example, 0.5 μm or higher, for example a value in the range between 0.5 and 1.0 μm. For special applications, even larger values may of course be chosen.

Figure 2:
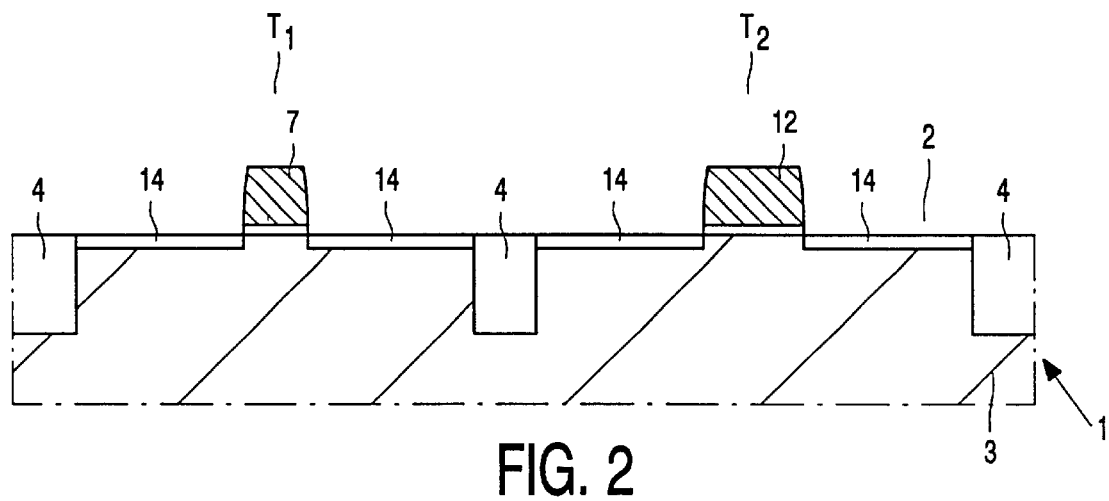
FIG. 2 shows this device in a first stage of the manufacture thereof.
Figure 3:
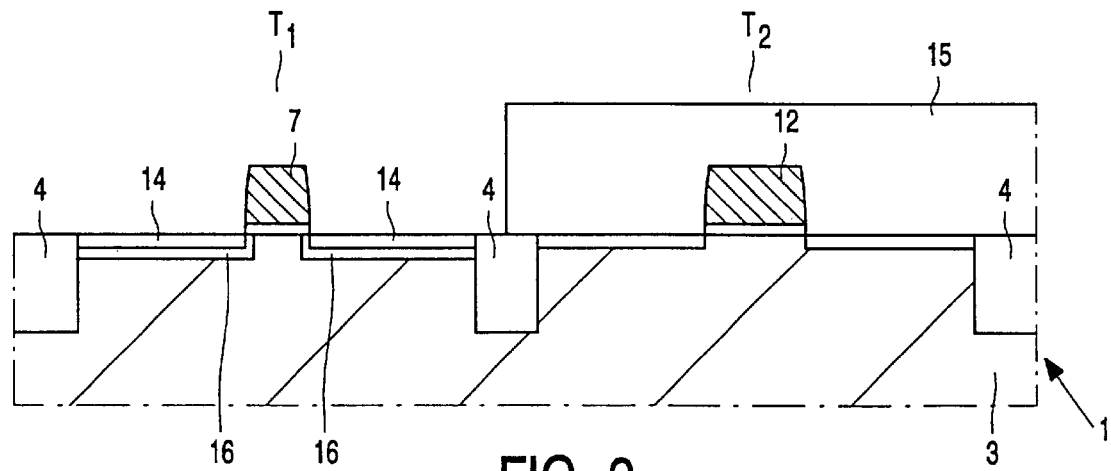
FIG. 3 shows the same device in a further stage of the manufacture thereof.

FIGS. 2 and 3 show several stages in the manufacture of the device. After the semiconductor body has been provided with the pattern 4 and with the gates 7 and 12, see FIG. 2, the LDD (lightly doped drain) implantation is carried out in a customary manner in both transistors to obtain the low n-doped regions 14 from which, in a later stage, the LDD zones 5a, 6a, 9a and 10a are formed. In a next stage, shown in FIG. 3, the region where transistor $T_2$ is formed is covered with a mask 15 which masks the underlying part of the body 1 from the halo implantation which is carried out next. Said halo implantation is carried out using boron ions in a dose of approximately $10^{13}$ per cm$^2$ and an energy of 10–15 keV. In transistor $T_1$, the halo implantations are indicated by means of reference numeral 16. After removal of the mask 15, the gates 7 and 12 can be provided with spacers 17 (see FIG. 1). Subsequently, the highly doped source and drain zones 5, 6, 9 and 10 can be provided. Next, the device can be subjected to customary process steps, such as silicidation and the provision of the interconnections, which will not be further discussed herein, since these steps are generally known.

It will be obvious that the invention is not limited to the example described herein, and that, within the scope of the invention, many variations are possible to those skilled in the art. For example, the invention can be advantageously used in p-channel MOS transistors. It is also possible to provide, along with the mask 15, a mask above a third transistor, which covers only one half of the transistor, i.e. only the source or the drain, whereby the halo implantation is carried out in the non-masked half of the transistor, resulting in the formation of an asymmetric structure. The halo implantation may alternatively be performed after the spacers 17 have been formed on the gates.

What is claimed is:

1. An integrated circuit with at least two field-effect transistors of a certain conductivity type, comprising a semiconductor body having a surface region of a first conductivity type adjoining a surface, which is provided with surface zones of the second, opposite, conductivity type forming source and drain zones of said transistors, characterized in that only one of said transistors, hereinafter referred to as first transistor, is provided with a halo implantation to suppress short-channel effects, and in that the other transistor, hereinafter referred to as second transistor, which fulfills an analog function in the circuit, is free of said halo implantation and has a larger channel length than the first transistor, wherein said channel length of the second transistor is such that the threshold voltage of the second transistor is equal, or at least substantially equal, to the threshold voltage of the first transistor.

2. An integrated circuit as claimed in claim 1, characterized in that the first transistor has a channel length below 1.0 μm.

3. An integrated circuit as claimed in claim 2, characterized in that the channel length of the first transistor is at most equal to 0.25 μm.

4. An integrated circuit as claimed in claim 1, characterized in that the first transistor serves for digital signal processing.

\* \* \* \* \*